United States Patent
Frese

(10) Patent No.: US 11,940,469 B2
(45) Date of Patent: Mar. 26, 2024

(54) CIRCUIT SYSTEM FOR MEASURING AN ELECTRICAL VOLTAGE

(71) Applicant: Robert Bosch GmbH, Stuttgart (DE)

(72) Inventor: Volker Frese, Beilstein (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/837,289

(22) Filed: Jun. 10, 2022

(65) Prior Publication Data

US 2022/0404396 A1   Dec. 22, 2022

(30) Foreign Application Priority Data

Jun. 17, 2021   (DE) ..................... 10 2021 206 219.9

(51) Int. Cl.
*G01R 19/10*     (2006.01)
*G01R 15/04*     (2006.01)
*G01R 19/257*    (2006.01)

(52) U.S. Cl.
CPC ............. *G01R 15/04* (2013.01); *G01R 19/10* (2013.01); *G01R 19/257* (2013.01)

(58) Field of Classification Search
CPC .. G01R 15/04; G01R 19/10; G01R 19/16519; G01R 19/16542; G01R 19/257; G01R 19/2503; G01R 31/392; G01R 31/378; G01R 19/2509; B60R 16/03; B60R 21/017; B60R 16/033; B60R 2021/01286; B60R 16/0231
See application file for complete search history.

(56) References Cited

U.S. PATENT DOCUMENTS

| | | | | |
|---|---|---|---|---|
| 4,560,937 A * | 12/1985 | Finger | ................ | G01R 31/3648 324/435 |
| 5,914,606 A * | 6/1999 | Becker-Irvin | ........ | G01R 31/396 340/636.15 |
| 6,369,576 B1 * | 4/2002 | Matthews | ........... | H02J 7/00047 324/426 |
| 6,992,915 B2 * | 1/2006 | Kang | ................ | H03K 19/0016 365/156 |
| 8,239,148 B2 * | 8/2012 | Wong | ..................... | G01R 15/04 320/134 |
| 10,345,384 B2 * | 7/2019 | Christophersen | .... | G01R 31/382 |

* cited by examiner

*Primary Examiner* — Vinh P Nguyen
(74) *Attorney, Agent, or Firm* — NORTON ROSE FULBRIGHT US LLP; Gerard A. Messina

(57) ABSTRACT

A circuit system for measuring an electrical voltage. The circuit system includes a voltage divider, an integrating element and an evaluating unit. The voltage divider receives, at an input, a first signal that represents the electrical voltage to be measured, and has a first switching element and a second switching element, and is capable of assuming a first state, in which the first switching element is conductive and the second switching element is non-conductive, and a second state in which the first switching element is non-conductive and the second switching element is conductive, and outputs a second signal at an output that is situated between the first switching element and the second switching element. The integrating element is designed to receive the second signal and to output a third signal. The evaluating unit being set up to accept and to evaluate the third signal in order to determine a value for the electrical voltage.

11 Claims, 2 Drawing Sheets

CIRCUIT SYSTEM FOR MEASURING AN ELECTRICAL VOLTAGE

CROSS REFERENCE

The present application claims the benefit under 35 U.S.C. § 119 of German Patent Application No. DE 10 2021 206 219.9 filed on Jun. 17, 2021, which is expressly incorporated herein by reference in its entirety.

FIELD

The present invention relates to a circuit system for measuring an electrical voltage, in particular a battery voltage, and to a method for measuring an electrical voltage having such a circuit system.

BACKGROUND INFORMATION

Central computing units that are used in automotive electronics, in particular in the area of automated driving, have come to require power supply levels of more than 300 W. Given a supply voltage of 12 V, such a power level results in a current of greater than 25 A, and, in cases of undervoltage as specified nowadays, can even result in a current greater than 40 A. In order to buffer a supply voltage collapse of e.g. 20 ms, as an example of a demand that is made, given a swing of 2 V a capacitance of 400 mF is required. It is to be noted that in such a scenario, all accesses to non-volatile storage media, such as EEPROM, SD card, etc., have to be "cleanly" terminated. In addition, data should be secured when possible. Here it is problematic that in vehicles there is no space for a capacitor having a capacitance of 400 mF.

Thus, there is only the possibility of early discharge of loads. In this case, if appropriate the large computers can be used in a power-saving mode, because the accesses to non-volatile memories are significantly slower than the provision of the data.

Therefore, an accurate measurement of the battery voltage is required so that a voltage collapse can be timely recognized. Typically, for this purpose a resistance voltage divider is used that in some cases is also constructed having FET (field-effect transistor) switches in order to save idle current and in order to divide the voltage to the measurement area of the analog-digital converter (ADC) of a microcontroller. The resistors also protect this measuring microcontroller against overvoltages by reducing the currents through the protective diodes. A capacitor before the ADC input stabilizes the measurement.

However, accuracy is a problem in such a circuit. The tolerance of the resistances of 2%, namely 6 Sigma, aging, temperature gradient, result in a tolerance of the divider alone of 4%. In addition, there are the tolerances of the ADC and the tolerances of the voltage reference for the ADC, which is usually the supply voltage of the microcontroller. This has the result that in most cases another 4% is added. Summed in linear fashion, the tolerance is then 8%.

A divider of 1:10 is assumed. In the worst case, it is 1:10.8. A minimum specified working voltage of 8 V has the result that the control device can discharge functions only starting from a measured voltage of 7.4 V. The energy reserve has to be correspondingly larger. Thus, it is appropriate to make a greater outlay for an accurate battery voltage measurement.

SUMMARY

The present invention provides a circuit system and a method for measuring an electrical voltage. Specific embodiments of the present invention result from the disclosure herein.

The presented circuit system in accordance with the present invention is used to measure an electrical voltage, in particular a battery voltage. The circuit system is used for example in a motor vehicle, to measure the voltage of a battery used in the motor vehicle.

In accordance with an example embodiment of the present invention, the circuit system has a voltage divider, an integrating element, and an evaluating unit, the voltage divider receiving, at an input, a first signal that represents the electrical voltage to be measured, and having a first switching element and a second switching element, and being capable of assuming a first state, in which the first switching element is conductive and the second switching element is non-conductive, and a second state in which the first switching element is non-conductive and the second switching element is conductive, and outputting a second signal to an output that is situated between the first switching element and the second switching element.

The voltage divider, which can also be designated a time divider, is thus an element that is to be controlled in such a way that it can assume these two states. The controlling with suitable control signals thus enables a kind of clocked operation of this voltage divider, or time divider.

The integrating element is designed to receive the second signal outputted by the voltage divider and to output a third signal that is correspondingly processed.

The evaluation unit is set up to receive the third signal and to evaluate it in order to determine a value for the electrical voltage. In this way, the electrical voltage, for example a battery voltage, can be determined very accurately, and thus measured.

Suitable for use in each case as switching element is a field-effect transistor, for example a MOSFET. Field-effect transistors are in wide distribution and are easily obtainable at low cost. For example, as first switching element a p-channel field-effect transistor can be used, and as second switching element a first n-channel field-effect transistor can be used. In addition, a second n-channel field-effect transistor can be provided for controlling the p-channel field-effect transistor of the voltage divider. In principle, a field-effect transistor can be provided for the controlling of the two switching elements, or at least one of the two switching elements.

As an integrating element, an RC element can be used, realized as a low-pass filter.

In a specific embodiment of the present invention, a comparator is provided as evaluation unit. In this case, an output of the comparator can be applied to a logical port that is applied to the voltage divider with a fixed clock pulse and in inverted fashion, so that the value of the electrical voltage is to be determined using a decimation filter.

In a further specific embodiment of the present invention, as evaluating unit an analog-digital converter (ADC) can be provided that accepts the third signal and a reference signal that represents a voltage reference, and compares the two signals to one another in order to determine the value for the electrical voltage to be measured.

In addition, a voltage source can be provided in order to provide the voltage reference.

In a further specific embodiment, a timer unit is provided in order to provide pulse-width-modulated signals (PWM) for controlling the switching elements.

In addition, a microcontroller can be provided in which the timer unit is integrated. Alongside this, the ADC or, depending on the realization, the comparator can also be integrated in the microcontroller.

With the described circuit system, a monitoring can be realized of a battery voltage and thus a battery voltage monitor can be realized, in particular for control devices having high power.

In this way, the tolerance for a battery voltage measurement can be reduced. This makes it possible in particular to discharge large consumers earlier, in order to complete necessary storage processes. For this purpose, no large-volume energy storage devices are required.

The presented method is used to measure an electrical voltage, in particular a battery voltage, for example in a motor vehicle. The method is carried out using a circuit system of the type described herein.

Further advantages and embodiments of the present invention result from the description herein and from the figures.

It will be understood that the features named above and explained below may be used not only in the respectively indicated combination, but also in other combinations or by themselves without departing from the scope of the present invention.

DETAILED DESCRIPTION OF EXAMPLE EMBODIMENTS

The present invention is shown schematically in the figures on the basis of specific embodiments, and is described in detail below with reference to the figures.

Figure 1:
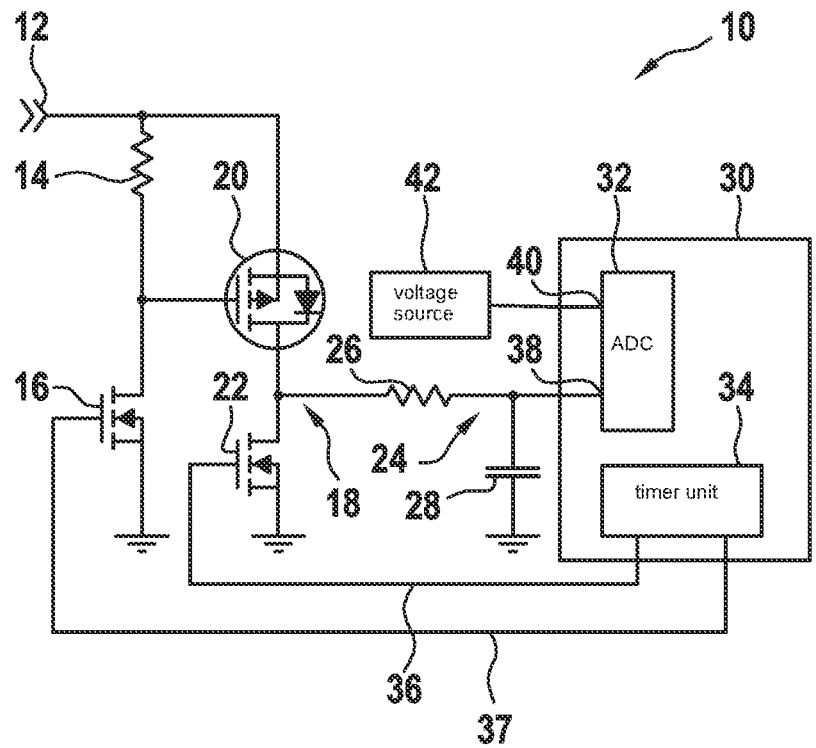
FIG. 1 shows, in a schematic diagram, a circuit system for carrying out an example embodiment of the method of the present invention.

FIG. 1 shows, in a schematic diagram, an embodiment of a circuit system for carrying out the presented method, designated as a whole by reference character 10. The representation shows an input 12 for a battery voltage to be measured, a resistor R2 14 of 20 kOhm and a second n-channel field-effect transistor 16, a voltage divider 18 having a p-channel field-effect transistor Tp 20 and a first n-channel field-effect transistor Tn 22, an RC element 24 having a resistor R1 26 of 20 kOhm and a capacitor C1 28, and a microcontroller 30.

In microcontroller 30, an ADC 32 and a timer unit 34 are provided. Timer unit 34 outputs PWM signals 36, 37. ADC 34 has a first input 38 for receiving a voltage to be measured or evaluated, and a second input 40 for receiving a voltage reference provided by a voltage source 42.

It is to be remembered that periods of time, or times, can be measured more accurately than an absolute voltage level. Voltage divider 18 in circuit system 10 is realized through an intermittent connection to a voltage source to be measured and a reference ground. The following RC element 24 smooths the voltage, and also protects first input 38 of ADC 32 against excess currents. In addition, a highly accurate reference voltage, provided by voltage source 42, having small temperature tolerances is required. In this way, the tolerance of this measurement can be reduced to below 2%.

The battery voltage to be measured is conducted via p-channel field-effect transistor Tp 20 to resistor R1 26, and to first n-channel field-effect transistor Tn 22. First n-channel field-effect transistor Tn 22 then goes to ground. In this way, high-ohmic resistor R1 26 can be connected in low-ohmic fashion to the voltage to be measured, as well as to ground. After resistor R1 26 there is situated buffer capacitor C1 28 having two functions, namely low-pass filter with R1 26 and buffer capacitor for the following ADC 32 in microcontroller 30.

For each field-effect transistor Tn 20 and Tp 22, a pulse-width-modulated (PWM) signal 36, 37 is required, and it has to be ensured that the two field-effect transistors 20, 22 are never switched at the same time. The ratio of the two "ON" times determines divider 1:

(ON_Tn+ON_Tp)/ON_Tp.

In the exemplary specific embodiment shown in FIG. 1 of circuit system 10, only two PWM signals 36, 37 are provided in microcontroller 30. For p-channel field-effect transistor Tp 20, an inverted signal is provided that is inverted with the second n-channel field-effect transistor 16. Instead of this second re-channel field-effect transistor 16, an npn transistor can also be used.

The highly precise voltage reference is also measured in ADC 32. If the two ADC values are set into relation, and this is multiplied by the voltage value of the reference and the divider ratio, the battery voltage value is obtained. Here the offset error of ADC 32 is also eliminated. The measurement accuracy can in addition be increased by applying the voltage value to capacitor C1 28, by modifying the PWM time divider ratio to be close to the voltage reference value. In this way, a large part of the ADC linearity error can be eliminated.

Figure 3:
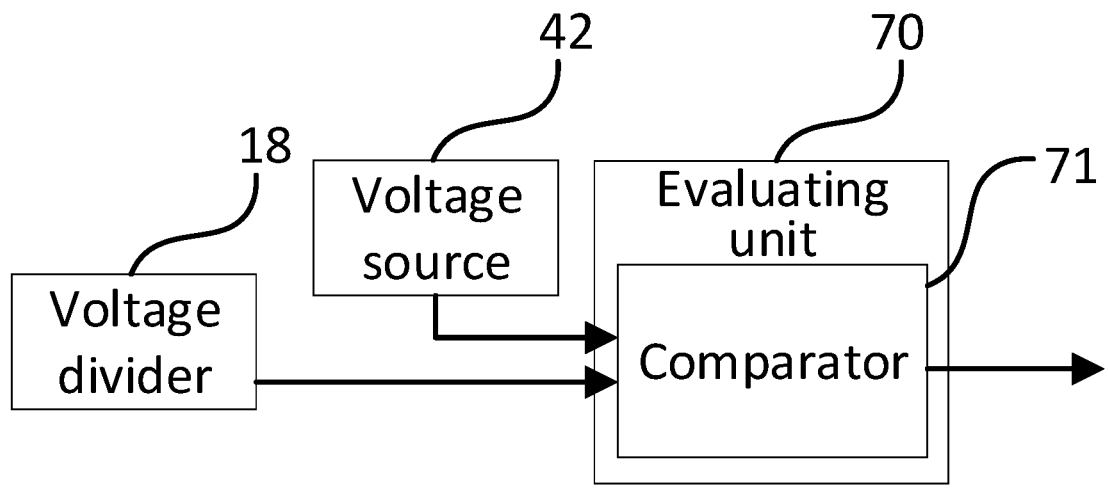
FIG. 3 shows a simplified schematic representation of a circuit system having a comparator for producing an output based on a comparison between a signal from a voltage divider and a reference voltage, according to an example embodiment of the present invention.

In a further specific embodiment, in analogous fashion to an SD (Sigma Delta) converter, ADC 32 can be completely omitted, so that only a comparator is used. For example, FIG. 3 is a simplified illustration of an example embodiment of a comparator 71 of an evaluation unit 70 obtaining the output from the voltage divider 18 and from the voltage source 42, and producing an output. The output of the comparator is then applied to a logical port. The port is read in with a fixed clock pulse, and is conducted in inverted fashion to the half-bridge formed by Tp 20 and Tn 22. Using a decimation filter, the voltage value is then calculated. The group runtime of the decimation filter again yields an additional delay. Thus, care is to be taken that Tp 20 and Tn 22 form a half-bridge.

An SD converter includes a so-called delta-sigma modulator that produces a bitstream, and a low-pass filter. The delta-signal modulation first fundamentally provides a coarse measurement of a signal. The resulting measurement error is integrated and is compensated for example via a counter-coupling.

In addition, it is to be taken into account that integrated modules are provided that have only one control input and that internally exclude the case of short-circuit in which both field-effect transistors are open. These are instead conceived as outputs with high current loads only if they can provide the maximum input voltage of 40 V. If a low-power half bridge for 40 V is present, this would thus be the ideal component.

Figure 2:
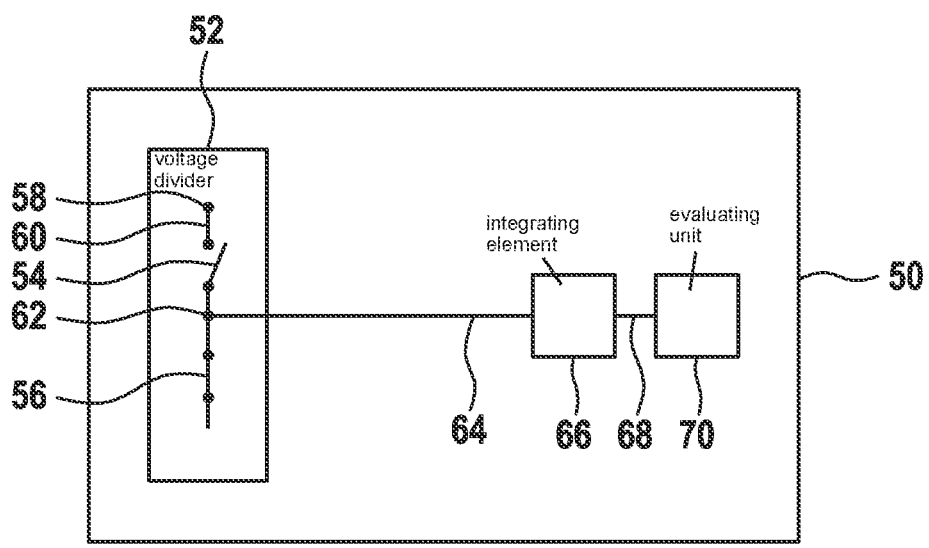
FIG. 2 shows, in a highly simplified fashion in a schematic representation, an example embodiment of the circuit system in accordance with the present invention.

FIG. 2 shows, in highly simplified form, an embodiment of the presented circuit system, designated as a whole by reference character 50. The representation shows a voltage divider 52 that includes a first switching element 54 and a second switching element 56. A state is shown in which first switching element 54 is open, and is thus non-conductive, and second switching element 56 is closed and is thus conductive.

A first signal 60 is received at an input 58 of voltage divider 52. A second signal 64 is outputted at an output 62 of voltage divider 52, which is situated between the two switching elements 54, 56. This second signal 64 is supplied to an integrating element 66 that in turn outputs a third signal 68. This third signal 68 is evaluated by the evaluating unit 70 in order to determine the value of a voltage that is represented by first signal 60.

The presented method and the described circuit system can be used in particular in control devices that require a large amount of current and an energy reserve. A nonvolatile memory, to which information is written such as for example configuration, errors, and operating cycle, is typically provided in each larger control device.

What is claimed is:

1. A circuit system for measuring electrical voltage, comprising:
   a voltage divider configured to receive, at an input, a first signal that represents the electrical voltage to be measured, and having a first switching element and a second switching element, the voltage divider being configured to assume a first state in which the first switching element is conductive and the second switching element is non-conductive, and a second state in which the first switching element is non-conductive and the second switching element is conductive, and the voltage divider is configured to output a second signal at an output situated between the first switching element and the second switching element;
   an integrating element configured to receive the second signal and to output a third signal; and
   an evaluating unit configured to accept the third signal and to evaluate the third signal to determine a value for the electrical voltage.

2. The circuit system as recited in claim 1, wherein each of the first and second switching elements is a field-effect transistor.

3. The circuit system as recited in claim 2, wherein the first switching element is a p-channel field-effect transistor, the second switching element is a first n-channel field-effect transistor.

4. The circuit system as recited in claim 3, wherein a second n-channel field-effect transistor is provided for controlling the p-channel field-effect transistor of the voltage divider.

5. The circuit system as recited in claim 1, wherein the integrating element is an RC element.

6. The circuit system as recited in claim 1, wherein the evaluating unit is a comparator.

7. The circuit system as recited in claim 1, wherein the evaluating unit is an analog-digital converter, which accepts the third signal and a reference signal that represents a voltage reference and compares the third signal and the reference signal to one another to determine the value for the electrical voltage to be measured.

8. The circuit system as recited in claim 7, wherein the voltage reference is a voltage source.

9. The circuit system as recited in claim 1, further comprising:
   a timer unit configured to provide pulse-width-modulated signals for controlling the first and second switching elements.

10. The circuit system as recited in claim 9, wherein the timer unit is integrated in a microcontroller.

11. A method for measuring an electrical voltage, the method comprising the following steps:
    receiving, by a voltage divider at an input, a first signal that represents the electrical voltage to be measured, the voltage divider having a first switching element and a second switching element, the voltage divider being configured to assume a first state in which the first switching element is conductive and the second switching element is non-conductive, and a second state in which the first switching element is non-conductive and the second switching element is conductive;
    outputting by the voltage divider a second signal at an output situated between the first switching element and the second switching element;
    receiving, by an integrating element, the second signal and outputting, by the integrating element a third signal; and
    accepting, by an evaluating unit, the third signal, the evaluating unit evaluating the third signal and determining a value for the electrical voltage based on the third signal.

* * * * *